(12) United States Patent
Kamijo

(10) Patent No.: US 6,432,594 B1
(45) Date of Patent: Aug. 13, 2002

(54) DEVICES FOR REDUCING DEFLECTION ABERRATIONS IN CHARGED-PARTICLE-BEAM OPTICAL SYSTEMS AND MICROLITHOGRAPHY APPARATUS COMPRISING SAME, AND RELATED METHODS

(75) Inventor: Koichi Kamijo, Kawasaki (JP)

(73) Assignee: Nikon Corporation, Tokyo (JP)

( * ) Notice: Subject to any disclaimer, the term of this patent is extended or adjusted under 35 U.S.C. 154(b) by 40 days.

(21) Appl. No.: 09/688,011

(22) Filed: Oct. 13, 2000

(30) Foreign Application Priority Data

Oct. 15, 1999 (JP) ............................................ 11-293078

(51) Int. Cl.⁷ .............................. G03F 9/30; G03C 5/00
(52) U.S. Cl. ........................ 430/30; 430/296; 430/942; 250/492.2
(58) Field of Search ........................ 430/30, 296, 942; 250/492.2

Primary Examiner—Christopher G. Young
(74) Attorney, Agent, or Firm—Klarquist Sparkman LLP

(57) ABSTRACT

Devices and methods are disclosed for reducing or eliminating deflection aberrations in charged-particle-beam (CPB) optical systems and CPB microlithography apparatus including such systems. The devices and methods also reduce the number of adjustment iterations required to make adjustments to compensators employed for correcting aberrations. In an imaging-optical system, an astigmatism compensator is used to eliminate linear aberrations generated by deflection of the beam. A four-fold-aberration compensator is used that eliminates the non-linear aberrations that are generated by beam deflection. The four-fold-aberration compensator is configured to generate a magnetic-field component proportional to $\cos[5\theta]$. Using such a compensator, linear aberrations generated whenever four-fold aberrations are eliminated are made smaller than when four-fold aberrations are eliminated by generating a magnetic-field component proportional to $\cos[3\theta]$, as in the past. Therefore, the number of adjustment iterations is decreased.

10 Claims, 6 Drawing Sheets

DEVICES FOR REDUCING DEFLECTION ABERRATIONS IN CHARGED-PARTICLE-BEAM OPTICAL SYSTEMS AND MICROLITHOGRAPHY APPARATUS COMPRISING SAME, AND RELATED METHODS

FIELD OF THE INVENTION

This invention pertains to microlithography (projection-transfer of a pattern, defined by a reticle or mask, to a suitable substrate using an energy beam). Microlithography is a key technology used in the manufacture of microelectronic devices (e.g., semiconductor integrated circuits), displays, and the like. More specifically, the invention pertains to microlithography performed using a charged particle beam such as an electron beam or ion beam. Even more specifically, the invention pertains to charged-particle-beam (CPB) microlithography apparatus and methods exhibiting reduced deflection aberrations, and to methods for adjusting deflection aberrations to reduce them.

BACKGROUND OF THE INVENTION

Charged-particle-beam (CPB) microlithography apparatus as developed over the past several years generally are grouped as follows: (1) spot-beam exposure systems, (2) variable-shaped beam exposure systems, and (3) block-exposure systems. In terms of resolution, each of these types of CPB exposure systems offers prospects of vastly superior performance than the previous batch-transfer optical microlithography systems (using visible or ultraviolet light). Unfortunately, each of these three types of exposure systems has poor throughput. The spot-beam exposure systems and variable-shaped beam systems exhibit especially poor throughput because they perform exposures by tracing the pattern using an extremely narrow beam typically having a square transverse profile (spot diameter). Block-exposure systems were developed to improve throughput by grouping groups of pattern features into uniformly shaped blocks each containing a partial pattern, and batch-exposing the blocks. However, because the number of pattern elements that can be placed on a reticle is limited, throughput was not improved as much as expected.

The development of "divided-reticle" CPB microlithography methods and apparatus offered prospects of improved throughput. In these methods and apparatus, the reticle is divided or segmented into a large number of pattern portions that individually and sequentially are projection-exposed onto the substrate. A conventional divided-reticle apparatus is depicted in FIGS. 6 and 7.

FIG. 6 depicts a wafer that has been exposed with multiple "dies" each corresponding to an individual "chip." As can be seen, each die is divided into multiple "stripes," and each stripe is divided into multiple "subfields." The reticle (not shown) defining the pattern transferred to each die is divided similarly. Each subfield on the reticle is exposed and thus transferred to the wafer individually.

A typical divided-reticle microlithographic exposure of a die pattern is depicted in FIG. 7. For exposure, the reticle is mounted on a movable reticle stage and the wafer is mounted on a movable wafer stage (neither stage is shown). From FIG. 7, it can be seen that the pattern as defined on the reticle is larger (by a predetermined magnification ratio) than the pattern as transferred onto the wafer. In other words, as the pattern is transferred from the reticle to the wafer, the pattern is "demagnified" by a "demagnification ratio" which is the reciprocal of the magnification ratio. The demagnification ratio is a characteristic of the projection lens that is used to make the exposure. In view of the demagnification, during exposure the reticle stage and wafer stage are moved so that the centers of corresponding stripes on the reticle and wafer, respectively, travel at respective constant velocities that are related to each other by the demagnification ratio. As each subfield is exposed, it is illuminated by a CPB "illumination beam." Portions of the illumination beam passing through the illuminated subfield become an "imaging beam" that is projected onto a wafer coated with a suitable resist. Projection is performed by passing the imaging beam through a projection-optical system.

Exposure normally is performed stripe-by-stripe and, within a stripe, subfield-by-subfield. During sequential exposure of the subfields in a stripe, the CPB illumination beam is deflected in a direction roughly perpendicular to the direction of travel of the reticle stage, thereby sequentially illuminating the subfields in a row within the stripe. The corresponding imaging beam is deflected similarly to place the subfield images properly on the wafer surface. As exposure of each row is completed, exposure progresses to the next row in the stripe with a concurrent reversal in the sweep direction of the beam. Exposure continues in this "raster" (switch-back) manner until all rows of subfields in the stripe are exposed. Exposure then progresses to the next stripe in the pattern. By sweeping the beam sequentially back and forth in a raster manner as shown in FIG. 7, throughput is improved compared to a scheme in which the beam is swept only in one direction across the rows of subfields.

In divided-reticle microlithography, since all the pattern elements in each of the subfield regions are exposed in a respective shot, and all the pattern elements to be transferred are defined on a single reticle, throughput can be improved markedly compared with other conventional CPB microlithography apparatus and methods.

In most reticles as used for divided-reticle CPB microlithography each subfield is surrounded by struts that strengthen the reticle (and separate the subfields one from another). Reticles used in optical microlithography typically do not have struts. Partly as a result of the struts, the illumination beam must be deflected and sized accurately to illuminate only the desired subfield at a given instant in time.

To increase throughput further in a divided-reticle microlithography apparatus, it is necessary to decrease the time during which the wafer and reticle are moving (to expose the next subfield) and to reduce the number of switch-backs. It also is necessary to minimize the overhead time consumed in starting and stopping the stages (to expose each subfield). One way in which this can be achieved is by expanding the beam-deflection range as much as possible. Unfortunately, as the magnitude of lateral deflection of a charged particle beam increases, deflection aberrations increase or arise. This is because, in being deflected a greater distance laterally, the beam passes through regions of the projection-optical system that are farther off-axis. Deflection aberrations are problematic because they cause blur and distortion of the image being exposed onto the wafer surface. Deflection aberrations can be reduced by adjusting the induction current of the deflectors used to deflect the beam and by configuring the deflection trajectory in a manner that reduces deflection aberrations. Although these remedies are useful to a limited extent, actual cancellation of deflection aberrations is desired through the use of corrective optical components such as stigmators (astigmatism compensators) and the like.

A stigmator conventionally is constructed by superimposing two quadrupole magnetic poles that are shifted 45° from one another about the optical axis. The respective magnitudes of electrical current supplied to each quadrupole can be adjusted separately. Hence, respective magnetic-field components can be generated that are proportional to cos[2θ], where the field distribution is expressed in a cylindrical coordinate system (z,r,θ) in which θ is the rotational angle around the optical axis. With such a scheme, aberrations proportional to the aperture angle of the illumination beam and aberrations proportional to the size of the illumination-beam subfield can be reduced or eliminated. Aberrations proportional to the illumination-beam aperture angle include, e.g., deflection astigmatism. Aberrations proportional to the size of the illumination-beam subfield include, e.g., deflection astigmatic distortion.

However, whenever the lateral beam-deflection distance is great, non-linear aberrations relative to the aperture angle and subfield size that are generated by even higher-order magnetic-field distributions become sufficiently large as to be no longer negligible and hence become problematic. Field components that are proportional to cos[3θ] and sin[3θ] primarily originate in manufacturing errors in the deflection coils and produce so-called four-fold aberrations. Four-fold aberrations originating in the 3θ magnetic-field component can be categorized into the following six types according to their parameter dependence: (1) deflection distortion, dependent only on the beam-deflection position (can be eliminated by adjusting the deflection current in the deflector); (2) deflection astigmatism, proportional to the aperture angle of the illumination beam (can be eliminated using a stigmator); (3) deflection astigmatic distortion, proportional to the subfield size (can be eliminated using a stigmator); (4) deflection coma, which is proportional to the square of the aperture angle of the illumination beam; (5) deflection hybrid astigmatism, which is proportional to the aperture angle of the illumination beam and the subfield size; and (6) non-linear distortion, which is proportional to the square of the subfield size. Of these six types, deflection coma, deflection hybrid astigmatism, and non-linear distortion cannot be eliminated using a deflector or stigmator.

Use of a device that generates a magnetic-field component proportional to cos[3θ] has been considered for possible elimination of deflection coma, deflection hybrid astigmatism, and non-linear distortion. This was attempted by overlaying two hexapole magnetic poles, shifted 30° from each another about the optical axis. As with a stigmator, four-fold aberrations could be eliminated by adjusting the magnitudes of the respective fields generated by the hexapole magnetic poles so as to generate field components proportional to cos[3θ] in a selective manner. Such a device is referred to herein as a 3θ-field four-fold-aberration compensator.

Whereas non-linear aberrations can be reduced or eliminated by changing the settings of a four-fold-aberration compensator, the values of linear aberrations in the overall optical system also are changed because a four-fold-aberration compensator itself produces linear aberrations. Hence, a correction procedure such as that shown in FIG. 8 typically is used conventionally in optical systems having both an astigmatism compensator (stigmator) and a four-fold-aberration compensator.

Specifically, in step S1, deflection astigmatism and deflection hybrid astigmatic distortion are eliminated by adjusting the stigmator. Next, in step S2, the four-fold aberrations are eliminated by adjusting the four-fold-aberration compensator. Then, in step S3, a determination is made of whether the aberrations in the system that can be eliminated exceed an acceptable range. If the aberrations are within the range, then adjustment is completed. If they are outside the range, then the procedure returns to step S1, and steps S1 and S2 are repeated.

In the conventional protocol shown in FIG. 8, linear aberrations that reappear in step S2 are usually not much smaller than the linear aberrations that supposedly were eliminated in step S1. This is a problem because it slows the process of zeroing in on the aberrations in the system that can be eliminated and increases the number of times that steps S1 and S2 must be repeated. This problem is not unique to electron-beam exposure apparatus; it also appears in CPB exposure apparatus in general.

SUMMARY OF THE INVENTION

In view of the shortcomings of conventional apparatus and methods as summarized above, an object of the invention is to provide charged-particle-beam (CPB) exposure apparatus, and methods for adjusting them, allowing reduced numbers of times that adjustments of compensators (that correct aberrations that can be eliminated) must be repeated. Hence, deflection aberrations are reduced, yielding improved methods for manufacturing microelectronic devices.

According to a first aspect of the invention, devices are provided for correcting aberrations in charged-particle-beam (CPB) microlithography apparatus. An embodiment of such a device is used in conjunction with a projection-optical system situated and configured to direct the imaging beam to the substrate so as to form an image on the substrate. The device includes at least one magnetic-field-generating device situated in the projection-optical system and configured to generate a magnetic-field component proportional to cos[5θ].

It has been discovered that fluctuations in linear aberrations (arising whenever non-linear four-fold aberrations are eliminated or reduced by generating a magnetic-field component proportional to cos[5θ]) are smaller than the fluctuations in linear aberrations (arising whenever non-linear four-fold aberrations are eliminated or reduced by generating a magnetic-field component proportional to cos[3θ]). Hence, a device according to the invention is termed a "5θ-field four-fold aberration compensator." The apparatus can include at least one stigmator.

Desirably, the 5θ-field four-fold-aberration compensator comprises multiple (at least two) 10-pole magnetic poles. With such a configuration, two 10-pole sets of magnetic poles are displaced rotationally from each other such that adjacent magnetic poles are 18° apart from each other about an optical axis. Of course, three or more 10-pole sets of magnetic poles can be used, with the magnetic poles being equi-angularly displaced from each other.

Another aspect of the invention is directed to CPB-microlithography methods in which an illumination beam is illuminated onto a region of a reticle to form an imaging beam, and the imaging beam is passed through a projection-optical system to form a corresponding image on a sensitive substrate. With respect to such methods, methods according to the invention are directed to controlling four-fold aberrations of the imaging beam. In an embodiment of such a method, the projection-optical system (imaging-optical system) is provided with at least one magnetic-field-generating device that generates a magnetic-field component proportional to cos[5θ]. An output of the magnetic-field-generating device is adjusted so as to produce the magnetic-field component proportional to cos[5θ].

As will be explained in detail in the detailed description, according to this method, fluctuations in linear aberrations (arising whenever non-linear four-fold aberrations are eliminated or reduced by generating a magnetic-field component proportional to cos[5θ]) are smaller than fluctuations in linear aberrations (arising whenever non-linear four-fold aberrations are eliminated or reduced by generating a field component proportional to cos[3θ]). Hence, this method allows elimination of non-linear four-fold aberrations without generating the large linear aberrations that were produced in conventional methods. This method also allows more rapid adjustments of aberration correction involving an iterative reduction in linear aberrations and non-linear four-fold aberrations.

In the foregoing method, a stigmator can be provided. Respective outputs of the stigmator and the magnetic-field-generating device are adjusted to maintain one or more of deflection astigmatism, deflection hybrid astigmatic distortion, and four-fold aberrations within respective pre-set tolerances. Since fluctuations in linear aberrations (arising whenever nonlinear four-fold aberrations are eliminated or reduced by generating a magnetic-field component proportional to cos[5θ]) are smaller than the fluctuations in linear aberrations (arising whenever non-linear four-fold aberrations are eliminated or reduced by generating a field component proportional to cos[3θ]), by alternately adjusting the outputs summarized above, the number of iterations needed to make the adjustments to within tolerances is reduced. Also, the various aberrations can be kept smaller compared to conventional methods in which outputs (of a stigmator and of a device for generating a field component proportional to cos[3θ]) are adjusted in an alternating manner.

The foregoing and additional features and advantages of the invention will be more readily apparent from the following detailed description, which proceeds with reference to the accompanying drawings.

DETAILED DESCRIPTION

This invention is described below in the context of a representative embodiment and examples. It will be understood that the invention is not limited to that embodiment or examples.

Representative Embodiment

Figure 1:
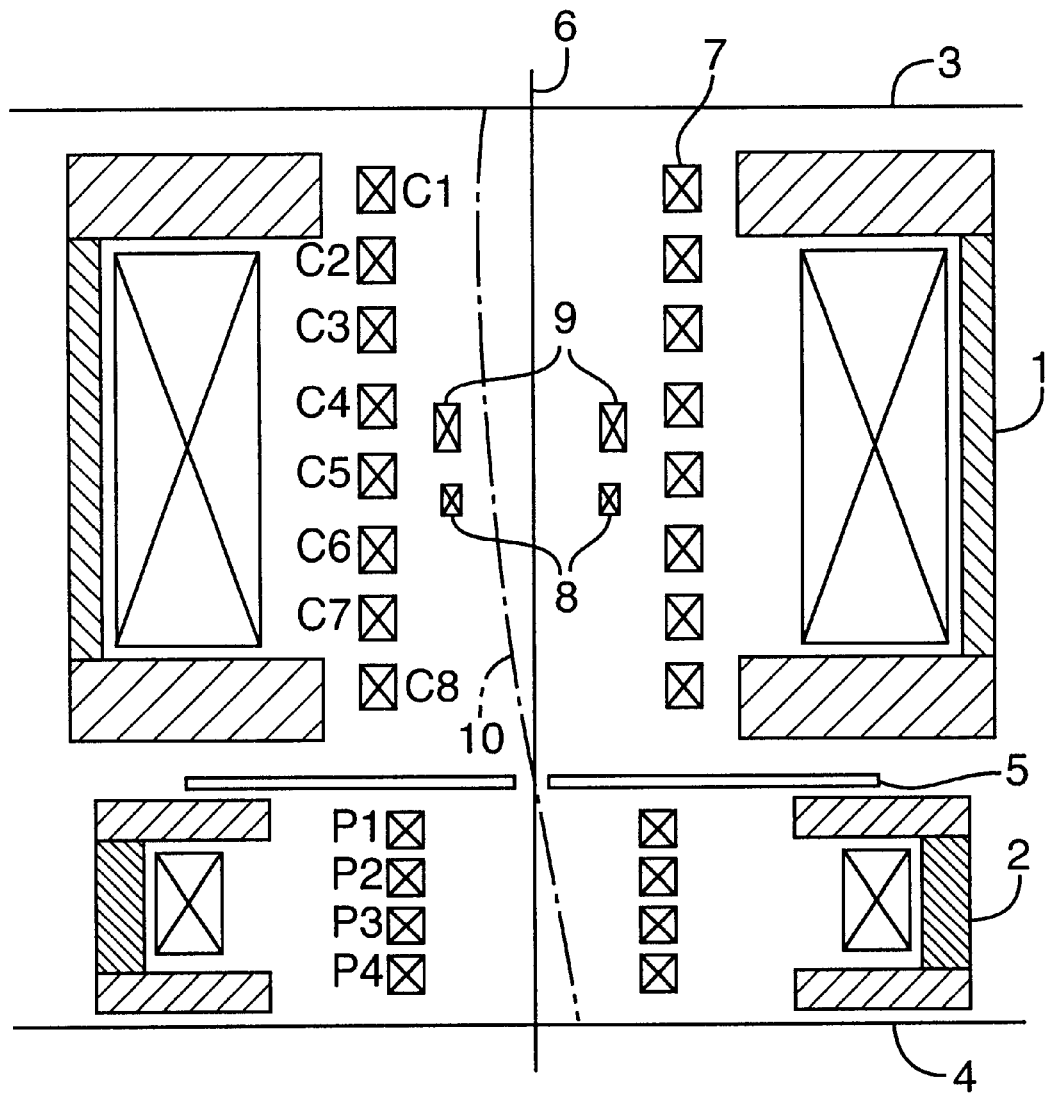
FIG. 1 schematically depicts as charged-particle-beam (CPB) imaging-optical system as used in a CPB microlithography apparatus according to a representative embodiment of the invention.

A projection-optical system, according to this embodiment, is depicted schematically in FIG. 1. The FIG.-1 optical system can be used as a projection-optical system in a charged-particle-beam (CPB) microlithography apparatus according to the invention. Although FIG. 1 is described in the context of using an electron beam, it will be understood that the general principles set forth in this regard also are applicable to, for example, an ion beam.

The FIG.-1 embodiment includes first and second lenses 1, 2, respectively, situated along an optical axis 6 downstream of a reticle 3 and upstream of a "sensitive" substrate (e.g., resist-coated wafer) 4. An imaging beam 10 passes in a generally axially direction through the lenses 1, 2. Between the lenses 1, 2 is a scattering aperture 5 through which the imaging beam 10 passes. Associated with the first lens 1 is a deflector 7, a stigmator 8, and a 5θ-field four-fold-aberration compensator 9.

The reticle 3 is irradiated by an illumination beam passing through an illumination-optical system (not shown, but understood to be situated upstream of the reticle 3). As the illumination beam passes through the illuminated region of the reticle 3, the resulting imaging beam 10 forms a corresponding image on the wafer 4 by means of the lenses 1, 2, thereby transferring a "reduced" (demagnified) image of the reticle pattern onto the wafer 4. The scattering aperture 5 disposed between the lenses 1, 2 blocks scattered particles of the beam that otherwise would cause image blurring.

The deflector 7 comprises eight elements (coils) C1–C18 disposed on the reticle side of the scattering aperture 5 and four elements P1–P4 disposed on the wafer side of the scattering aperture 5. The elements of the deflector 7 perform several functions. First, they deflect the imaging beam propagating from the illuminated region on the reticle 3 so that the imaging beam propagates along a desired trajectory through the scattering aperture 5 and forms an image at the desired position on the wafer 4. Second, they act to cancel out image distortion and aberrations.

The stigmator 8 eliminates linear aberrations generated as a result of bean deflection. The four-fold-aberration compensator (non-linear four-fold-aberration compensator) 9 eliminates non-linear aberrations generated by deflection of the beam. In this embodiment, a 5θ-field component is generated using these two devices 8, 9. To such end, each device 8, 9 comprises a respective set of ten coils arranged at equal-angle spacing around the axis. One set of coils is displaced rotationally with respect to the other set to form a nominal half-angle between adjacent coils of 18° (i.e., adjacent coils of different sets are situated 18° apart (about the axis 6)). See FIG. 3.

First Example Embodiment

In a first example embodiment, the axial distance between the reticle 3 and the wafer 4 is 600 mm. The respective induction currents applied to the lenses 1, 2 are set so that the illuminated region on the reticle 3 is 0.25-mm square on the wafer 4, yielding a demagnification ratio of ¼. In the following evaluation, a pattern on the reticle 3 is irradiated with an illumination beam, having a 6 mrad aperture angle, to a position on the wafer surface 4 laterally displaced 2.5 mm from the optical axis 6.

The respective nominal half-angles of the coils in each deflector 8, 9 are set so that essentially no registration aberrations occur on the wafer. The performance of the four-fold-aberration compensator 9 is evaluated by intentionally generating a 27-nm four-fold non-linear distortion in the overall system as a correction target. This is generated by shifting some of the coils of the deflector assemblies C1–C8 and P1–P4 by 1°, and then measuring the amount of change in the linear aberration whenever the target aberration was corrected.

Comparison Example

Figure 2:
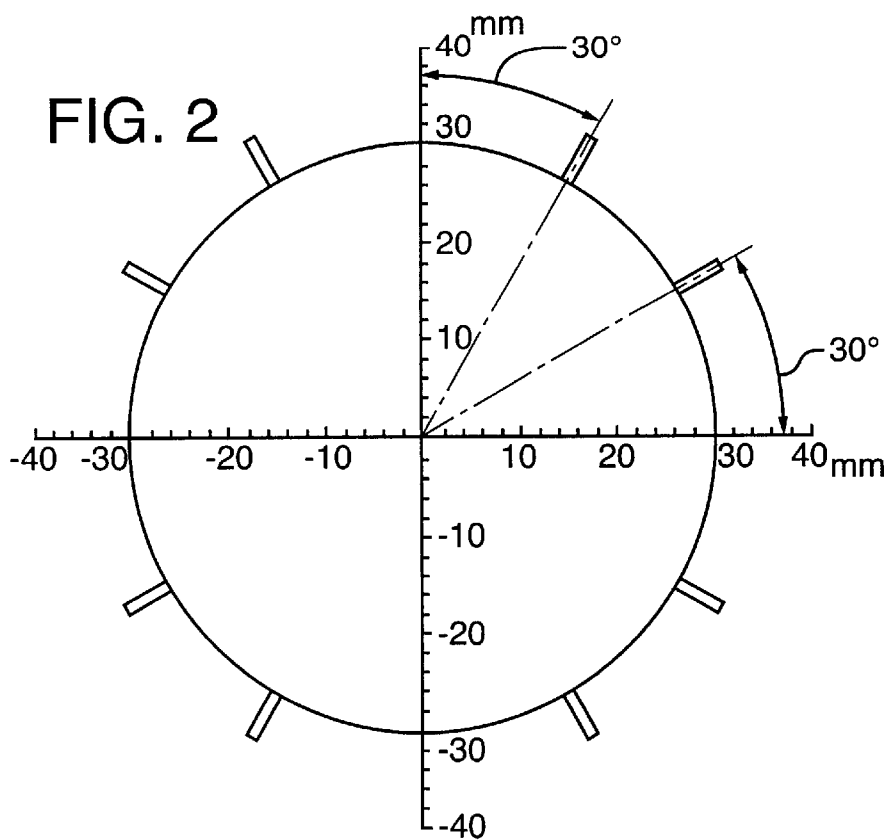
FIG. 2 is an axial diagram showing positions of coils of a 3θ-field four-fold-aberration compensator according to a comparison example.

As a comparison example, a 3θ-field four-fold-aberration compensator, such as that shown in FIG. 2, was used instead of the 5θ-field four-fold-aberration compensator 9. The four-fold-aberration compensator of FIG. 2 is one in which two deflecting devices are used. In each device, six coils are arranged at equal-angle spacing about the axis. The two sets are arranged so as to have a nominal half-angle of 30° between adjacent coils. I.e., the coils are disposed with a 30° displacement between adjacent coils of different devices. The coils of each device are driven by a separate power supply. The coils of this comparison example are 45 mm long along the optical axis, 30 mm inside diameter, and 35 mm outside diameter. The four-fold-aberration compensator of this comparison example is disposed coaxially with the optical axis, with a center being situated along the optical axis 200 mm from the reticle 3.

Second Example Embodiment

Figure 3:
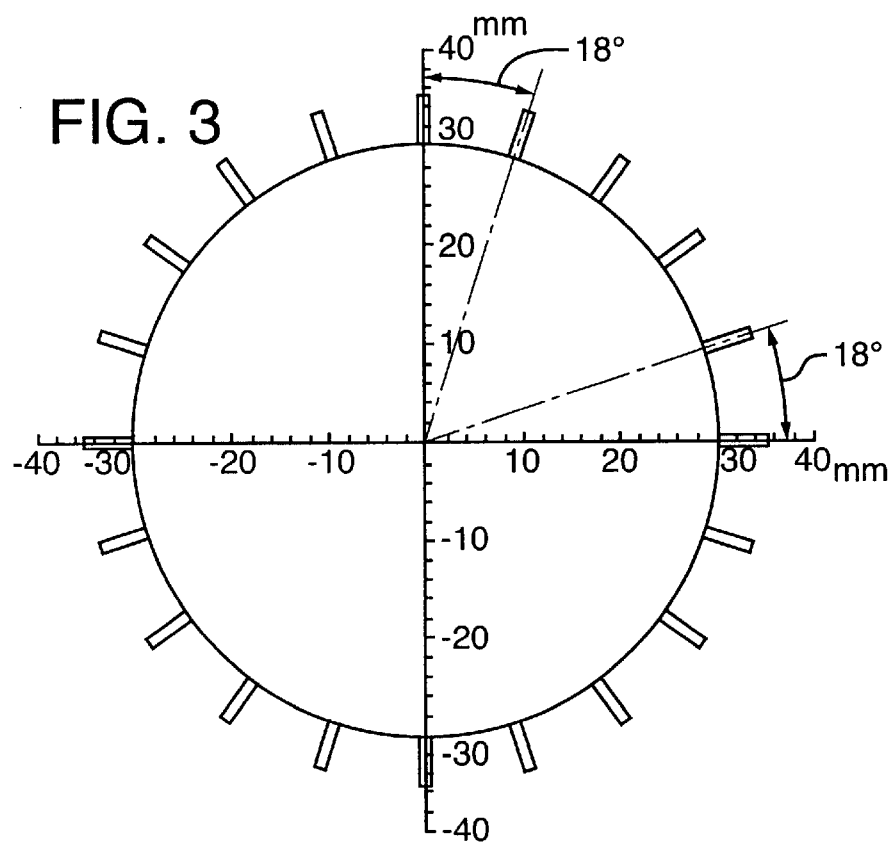
FIG. 3 is an axial diagram showing positions of coils of a 5θ-field four-fold-aberration compensator according to an example embodiment.

In this embodiment, a four-fold-aberration compensator that generates a 5θ-field component, as depicted in FIG. 3, is used. This four-fold-aberration compensator includes two devices. Each device comprises ten coils arranged at an equal-angle spacing about the axis, with a nominal half-angle of 18° between adjacent coils of different devices. I.e., the coils of each device are disposed in alternating order about the axis, with 18° between adjacent coils of the two devices. The coils of each device are driven by a separate power supply. The axial length, inside diameter, outside diameter, and respective positions of the coils in this embodiment are equal to respective variables in the first example embodiment. These data are listed in Table 1, below.

TABLE 1

| | | Comparison Example | Example Embodiment |
|---|---|---|---|
| Dimensions and position of four-fold-aberration compensator | Length along optical axis (mm) | 45 | 45 |
| | Inside diameter (mm) | 30 | 30 |
| | Outside diameter (mm) | 35 | 35 |
| | Position (mm) | 200 | 200 |
| Linear aberrations generated when four-fold nonlinear distortion was eliminated | Deflection astigmatism (nm) | 415 | 140 |
| | Deflection astigmatic distortion (nm) | 937 | 319 |

Whenever a 3θ-field four-fold-aberration compensator (according to the comparison example) was used, the changes in deflection astigmatism and deflection astigmatic distortion realized when the four-fold non-linear distortion was eliminated were approximately 420 nm and 940 nm, respectively. In contrast, the changes in deflection astigmatism and deflection astigmatic distortion realized when the example embodiment of a 5θ-field four-fold-aberration compensator was used to eliminate four-fold non-linear distortion were approximately 140 and 320 nm, respectively.

Figure 8:
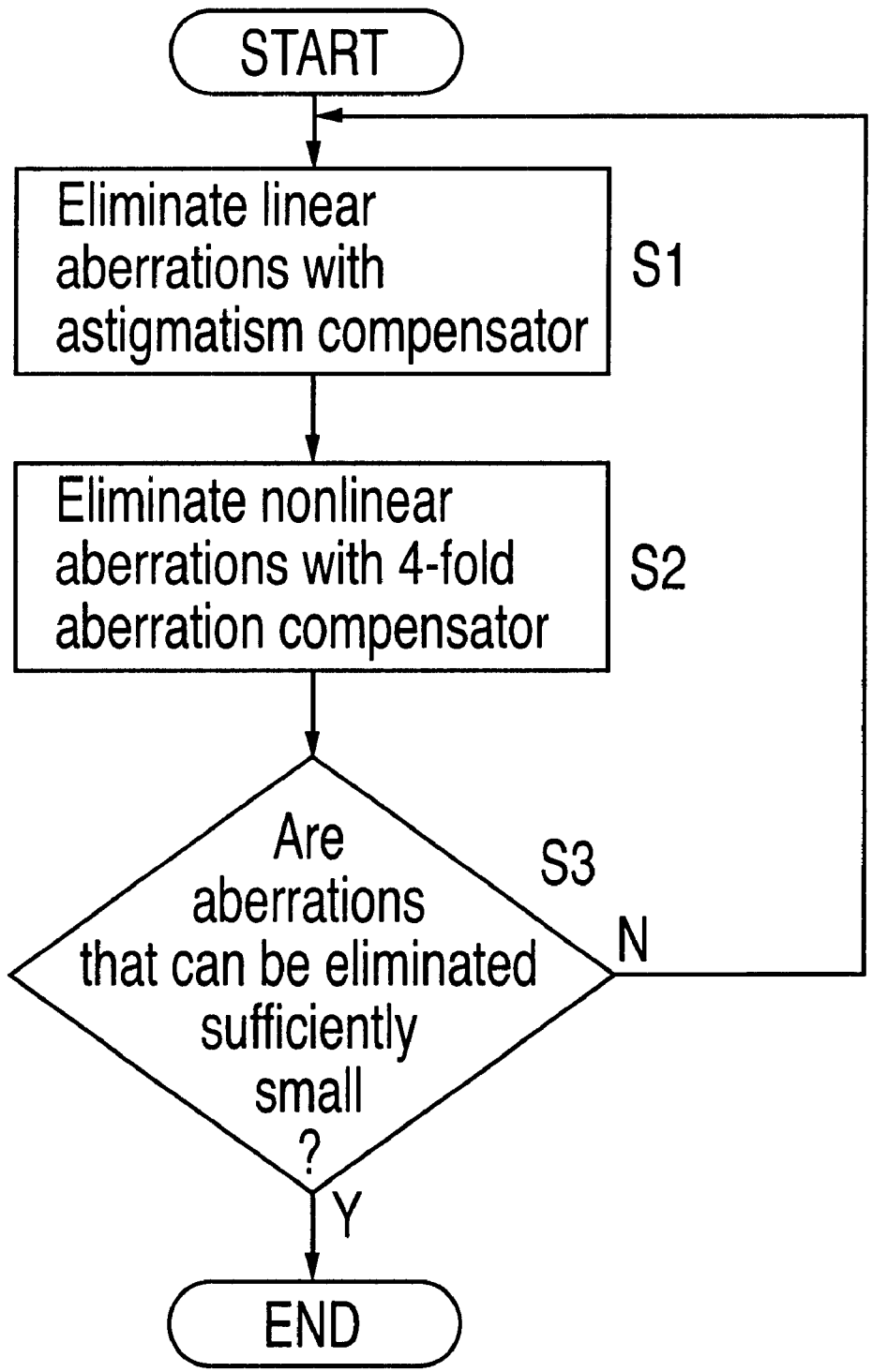
FIG. 8 is a flowchart of a conventional process for decreasing aberrations that can be eliminated, in a CPB optical system, using a four-fold-aberration compensator and a stigmator.

It will be appreciated readily by persons of ordinary skill in the art that the number of iterations necessary to reduce the stigmator and four-fold aberrations to a satisfactory low level are decreased by using a correction procedure such as that shown in FIG. 8.

Figure 4:
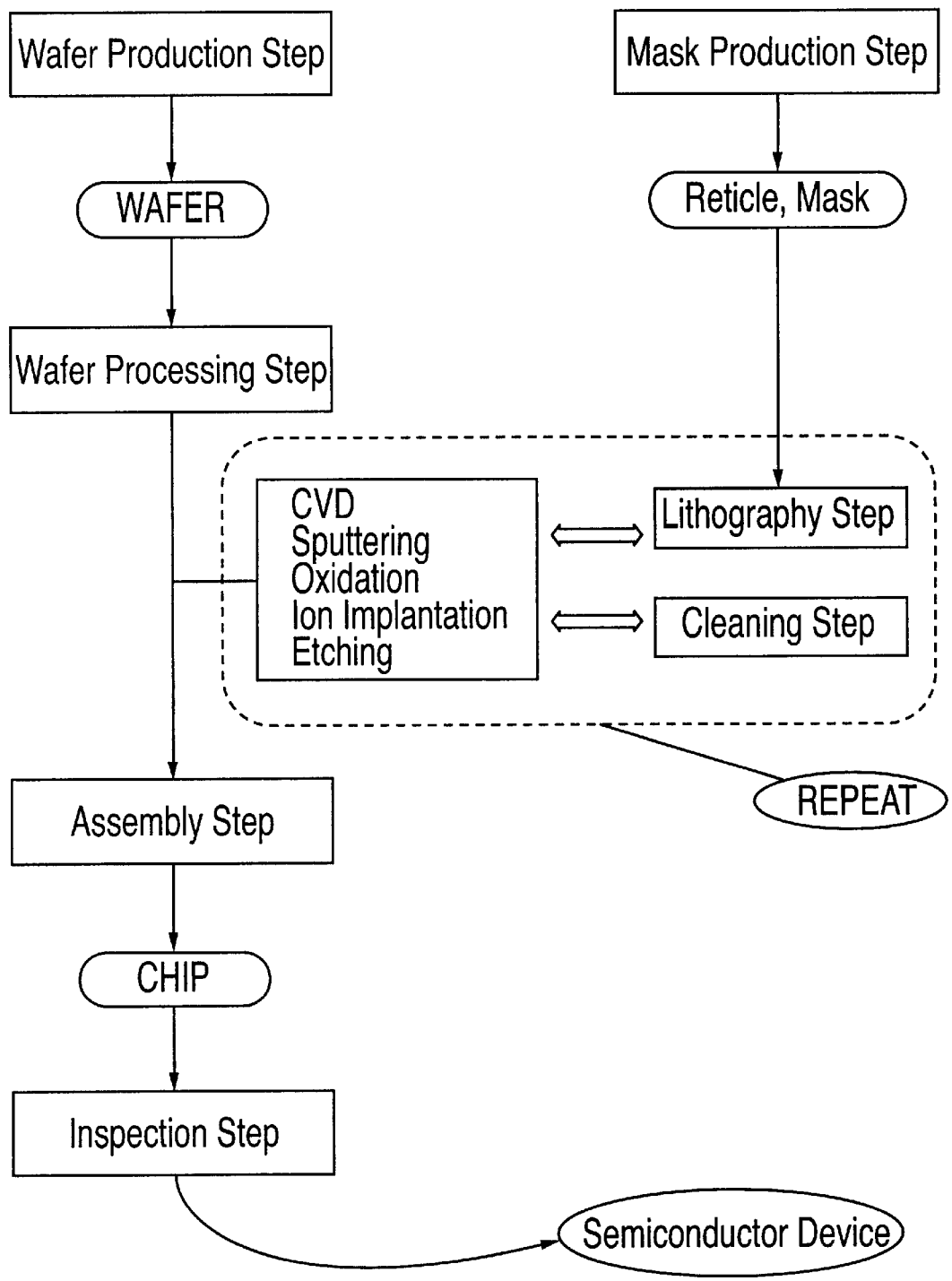
FIG. 4 is a process flowchart for manufacturing a microelectronic device, wherein the process includes a CPB microlithography method according to the invention.

FIG. 4 is a flowchart of an exemplary microelectronic-device fabrication method to which apparatus and methods according to the invention readily can be applied. The fabrication method comprises the main steps of wafer production (wafer preparation); reticle production (reticle preparation); wafer processing; device assembly, dicing, and making the devices operational; and device inspection. Each step usually comprises several sub-steps.

Among these main steps, wafer processing is key to achieving the smallest feature sizes (critical dimensions), best inter-layer registration, and performance of the microelectronic devices. In the wafer-processing step, multiple circuit patterns are layered successively atop one another on the wafer, wherein the formation of each layer typically involves multiple sub-steps. Usually, many operative microelectronic devices (e.g., microprocessor chips or memory chips) are produced on each wafer.

Typical wafer-processing steps include: (1) thin-film formation (by, e.g., CVD or sputtering) involving formation of a dielectric layer for electrical insulation or a metal layer for connecting wires; (2) oxidation to oxidize the thin film or the surface of the wafer itself; (3) microlithography to form a resist pattern (as defined by a reticle) on the wafer for selective processing of the thin film or the substrate itself; (4) etching (e.g., dry etching) or analogous step to etch the thin film or wafer according to the resist pattern; (5) doping or impurity implantation to implant ions or impurities into the thin film or wafer; (6) resist stripping to remove the resist from the wafer; and (7) chip inspection. Wafer processing is repeated as required to (typically many times) to fabricate the desired microelectronic devices on the wafer.

Figure 5:
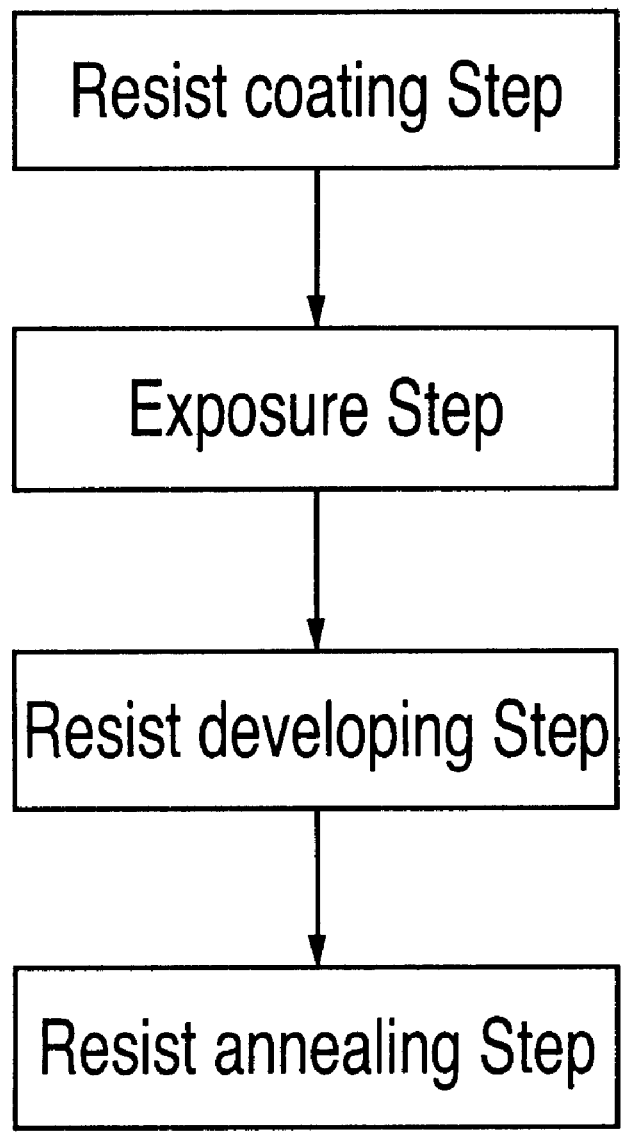
FIG. 5 is a process flowchart for performing a microlithography method performed using a CPB microlithography apparatus according to the invention.
Figure 6:
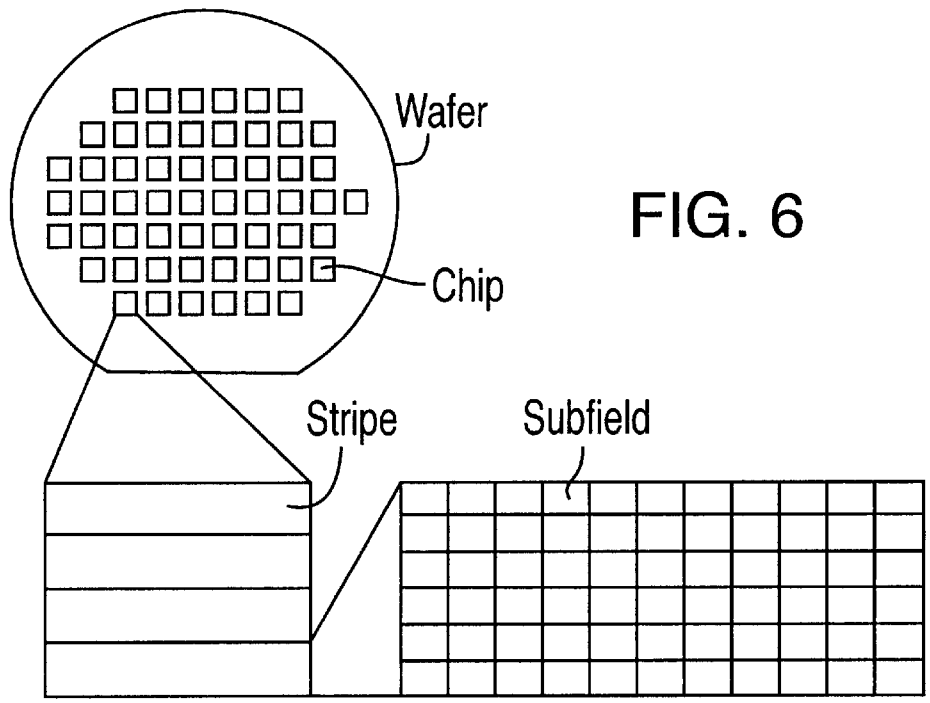
FIG. 6 schematically depicts a conventional division of a pattern for a die into multiple stripes, and each stripe into multiple subfields arranged in multiple rows, as used in divided-reticle CPB microlithography.
Figure 7:
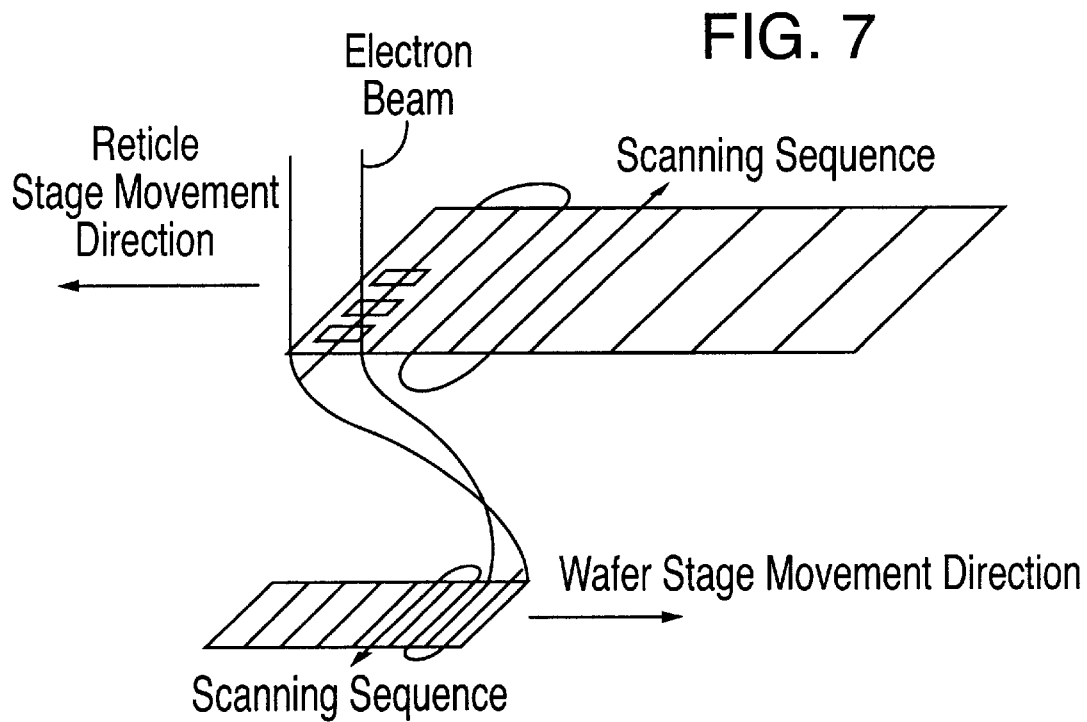
FIG. 7 schematically depicts a conventional manner in which a divided reticle is exposed during CPB microlithography.

FIG. 5 provides a flowchart of typical steps performed in microlithography, which is a principal step in wafer processing. The microlithography step typically includes: (1) a resist-coating step, wherein a suitable resist is coated on the wafer surface (which can include a circuit pattern formed in a previous wafer-processing step); (2) an exposure step, to expose the resist with the desired pattern and form a latent image of the pattern in the resist; (3) a development step, to develop the latent image in the exposed resist; and (4) an optional annealing step, to enhance the durability of the developed resist pattern.

These wafer-production steps, reticle-production steps, wafer-processing steps, and microlithography steps are well known. Hence, additional description of these steps is unnecessary.

The microlithography step noted above is the principal step in which a pattern with a small linewidth can be exposed and transferred to a substrate using a CPB microlithography apparatus according to the invention.

In any event, since defocusing and distortion of the image during exposure and transfer are minimized using methods and apparatus according to the invention, intricate patterns can be exposed microlithographically in an accurate manner.

Whereas the invention has been described in connection with multiple embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a charged-particle-beam (CPB) microlithography apparatus for illuminating a region on a pattern-defining reticle with an illumination beam to form an imaging beam and directing the imaging beam to a sensitive substrate, a device for correcting aberrations, the device comprising:

a projection-optical system situated and configured to direct the imaging beam to the substrate so as to form an image on the substrate; and at least one magnetic-field-generating device situated in the projection-optical system and configured to generate a magnetic-field component proportional to cos[5θ].

2. The apparatus of claim 1, wherein the magnetic-field-generating device comprises multiple 10-pole sets of magnetic poles.

3. The apparatus of claim 2, further comprising a stigmator.

4. The apparatus of claim 1, further comprising a stigmator.

5. In a charged-particle-beam (CPB) microlithography method in which an illumination beam is illuminated onto a region of a reticle to form an imaging beam, and the imaging beam is passed through a projection-optical system to form a corresponding image on a sensitive substrate, a method for controlling four-fold aberrations of the imaging beam, the method comprising:

providing the projection-optical system with at least one magnetic-field-generating device that generates a magnetic-field component proportional to cos[5θ]; and adjusting an output of the magnetic-field-generating device to produce the magnetic-field component proportional to cos[5θ].

6. The method of claim 5, further comprising the steps of:
providing a stigmator; and adjusting respective outputs of the stigmator and the magnetic-field-generating device to maintain one or more of deflection astigmatism, deflection hybrid astigmatic distortion, and four-fold aberrations within respective pre-set tolerances.

7. A CPB microlithography apparatus, comprising a device according to claim 1.

8. A microelectronic-device fabrication process, comprising the steps of:

(a) preparing a wafer;

(b) processing the wafer; and (c) assembling devices on the wafer during steps (a) and (b), wherein step (b) comprises the steps of (i) applying a resist to the wafer; (ii) exposing the resist; (iii) and developing the resist; and step (ii) comprises providing a CPB microlithography apparatus as recited in claim 7; and using the CPB microlithography apparatus to expose the resist with the pattern defined on the reticle.

9. A CPB-microlithography method, comprising a method for controlling aberrations according to claim 5.

10. A method for fabricating a microelectronic device, comprising the steps of:

(a) preparing a wafer;

(b) processing the wafer; and (c) assembling devices on the wafer during steps (a) and (b), wherein step (b) comprises a method for performing CPB microlithography as recited in claim 9.

* * * * *

UNITED STATES PATENT AND TRADEMARK OFFICE
CERTIFICATE OF CORRECTION

PATENT NO.     : 6,432,594 B1
DATED          : August 13, 2002
INVENTOR(S)    : Koichi Kamijo It is certified that error appears in the above-identified patent and that said Letters Patent is hereby corrected as shown below:

<u>Column 6,</u>
Line 30, "C1-C18" should be -- C1-C8 --.

Signed and Sealed this

Fifteenth Day of July, 2003

JAMES E. ROGAN
*Director of the United States Patent and Trademark Office*